United States Patent [19]

Koe

[11] Patent Number: 4,488,930

[45] Date of Patent: Dec. 18, 1984

[54] PROCESS FOR PRODUCING CIRCULAR GALLIUM ARSENIDE WAFER

[75] Inventor: Kiyohiko Koe, Hyogo, Japan

[73] Assignee: Sumitomo Electric Industries, Ltd., Osaka, Japan

[21] Appl. No.: 382,979

[22] Filed: May 28, 1982

Related U.S. Application Data

[63] Continuation of Ser. No. 227,117, Jan. 21, 1981, abandoned.

[30] Foreign Application Priority Data

Jan. 26, 1980 [JP] Japan ................................. 55-8086

[51] Int. Cl.³ ............................................. C30B 29/00
[52] U.S. Cl. ........................ 156/616 R; 156/DIG. 65
[58] Field of Search ............. 125/13 R, 15; 51/283 E; 156/616 R, 616 H, 620, 617 SP, DIG. 65, DIG. 70, 154, 155, 344, 624, 622, 610

[56] References Cited

U.S. PATENT DOCUMENTS

| | | | |
|---|---|---|---|
| 3,475,867 | 11/1969 | Walsh | 156/155 |
| 3,520,810 | 7/1970 | Plaskett et al. | 156/DIG. 65 |
| 3,834,083 | 9/1974 | Hoshi et al. | 156/DIG. 65 |
| 3,970,494 | 7/1976 | Pritchard | 156/155 |
| 4,084,354 | 4/1978 | Grandia et al. | 125/3 |
| 4,239,567 | 12/1980 | Winings | 156/154 |

FOREIGN PATENT DOCUMENTS

| | | | |
|---|---|---|---|
| 34069 | 10/1973 | Japan | 156/DIG. 65 |
| 15582 | 5/1979 | Japan | 51/283 R |

OTHER PUBLICATIONS

Richaros, "Growth of GaAshy Horizontal Zone Melting", 3160, J. of Applied Physics, 600-3.
Moore, Solid State Technology, 2/1975, pp. 40-43.

Primary Examiner—Hiram H. Bernstein
Attorney, Agent, or Firm—Sughrue, Mion, Zinn, Macpeak and Seas

[57] ABSTRACT

A process for producing a circular gallium arsenide wafer including the steps of growing a gallium arsenide single-crystal boule in the form of a longitudinal half of a cylinder by the boat method in such a manner that the intersection of the flat surface produced by the boat method and the plane vertical to the direction of crystal growth extends in a <110> direction, slicing the boule into wafers to expose a (100) plane or a plane inclined within 0.5 to 5 degress with respect to the (100) plane, assembling the resulting triangular-like wafers into a triangular-like prism, grinding the opposite edges of the flat surface of the outer periphery of the triangular-like prism of wafers in a direction in which the wafers are assembled; and separating the triangular-like prism into discrete circular wafers.

7 Claims, 8 Drawing Figures

4,488,930

PROCESS FOR PRODUCING CIRCULAR GALLIUM ARSENIDE WAFER

This is a continuation of application Ser. No. 227,117, filed Jan. 21, 1981, now abandoned.

BACKGROUND OF THE INVENTION

1. Field of the Invention

The present invention relates to a process for producing gallium arsenide wafers having few crystal defects and a uniform low dislocation density and a (100) plane or a plane inclined within a few degrees of the (100) plane.

2. Description of the Prior Art

Because of its unique nature, gallium arsenide is currently being used in semiconductor devices as a substrate crystal for epitaxial growth or ion implantation. In most cases, the gallium arsenide substrate crystal used as a wafer is sliced from a rod-shaped single-crystal boule produced by a "boat" method such as the horizontal Bridgman method, a gradient freezing method, or a pulling method. Conventionally, there are two requirements that must be met by these wafers. One is that they are round or circular because the circular form is easy to obtain by jigs in the process of epitaxial growth. Also, this form helps standardize the manufacturing requirements of semiconductor devices, facilitates the automatic work of wafer processing and has a high reproducibility. The second requirement is that the wafers have few crystal defects and uniform low dislocation density so as to extend the life of semiconductor devices and improve their performance.

The nature of the boat method is such that it is not capable of producing a round bar of gallium arsenide single-crystal boule but instead provides a boule 1 in the form of a longitudinal half of a cylinder as shown in FIG. 1. Such a boule often presents much difficulty in handling the triangular-like wafers including so-called "D-shape" wafers that are sliced from it in a direction oblique to the direction of crystal growth. The conventional alternative is to slice circular wafers from a rod-shaped gallium arsenide single-crystal boule 2 (FIG. 2) produced by the pulling method. But as shown by the hatched area in FIG. 3, a circular wafer 3 produced by the pulling method has a high density of dislocations as well as fairly great number of crystal defects throughout.

With the increase in the demand for gallium arsenide semiconductor devices of improved performance, the manufacture of gallium arsenide single-crystal boules from which circular wafers having few crystal defects and a uniform low dislocation density can be cut is especially desirable.

SUMMARY OF THE INVENTION

Therefore, a primary object of the invention is to provide a circular gallium arsenide wafer having few crystal defects and uniform low dislocation density.

The invention is based on the finding that triangular-like wafers sliced from a gallium arsenide single-crystal boule in the form of a longitudinal half of a cylinder produced by the boat method have fairly few crystal defects and that the area of high dislocation density indicated by the hatched area in FIG. 4 is concentrated on both ends 5 of the straight side 4 of a wafer that is commonly used as the reference plane (flat orientation) of a pattern mask.

A process of the invention includes the steps of growing a gallium arsenide single-crystal boule in the form of a longitudinal half of a cylinder by the boat method in such a manner that the intersection of the flat surface produced by the boat method and the plane vertical to the direction of crystal growth extends in a <110> direction, slicing the boule into wafers to expose a (100) plane or a plane inclined by 0.5 to 5 degrees with respect to the (100) plane, assembling the resulting triangular-like wafers together into a triangular-like prism, grinding the opposite edges of the flat surface of the outer periphery of the triangular-like prism of wafers in the direction in which the wafers are assembled, and separating the triangular-like prism into discrete circular wafers.

DESCRIPTION OF THE PREFERRED EMBODIMENTS

A process for producing a circular gallium arsenide wafer in accordance with the invention will be described with reference to the accompanying drawings. First, using the three-temperature horizontal Bridgman method described in Japanese Patent Publication No. 35861/73 which uses an oven having three different temperature distributions, a longitudinal half of a cylindrical gallium arsenide single-crystal boule is grown, for example, the <111> direction in such a manner that the intersection of the flat surface produced by that method and the plane vertical to the direction of crystal growth extends in the <110> direction. As an alternative, the conventional boat method may be used to produce the longitudinal half of a cylindrical gallium arsenide single-crystal boule.

To obtain wafers defined by the (100) plane, a given thickness of wafer is sliced from the boule in a direction that is inclined by 54.7 degrees from the (111) plane toward the flat surface 12. Since a crystal produced by an epitaxial growth technique easily provides a flat growth plane, the angle of inclination need not be precisely 54.7 degrees. An angle of from 0.5 to 5 degrees off from the (100) plane can be often employed.

Figure 1:
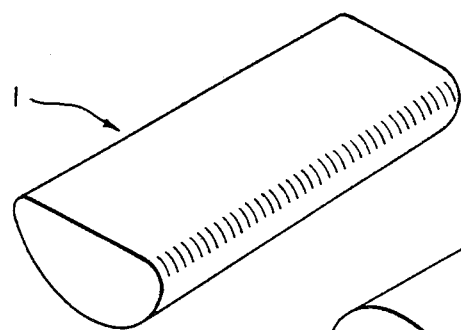
FIG. 1 is a perspective view of a gallium arsenide single-crystal boule produced by the boat method.
Figure 2:
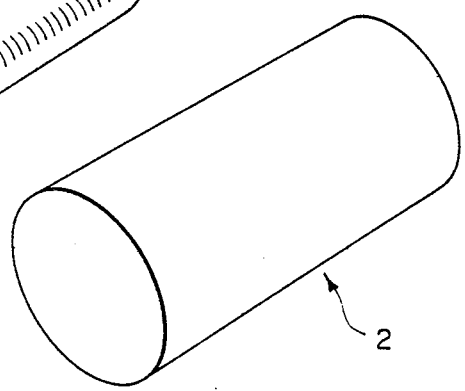
FIG. 2 is a perspective view of a gallium arsenide single-crystal boule produced by the pulling method.
Figure 3:
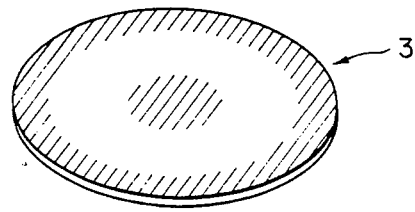
FIG. 3 is a perspective view showing uneven dislocations in a circular wafer sliced from the boule of FIG. 2.
Figure 4:
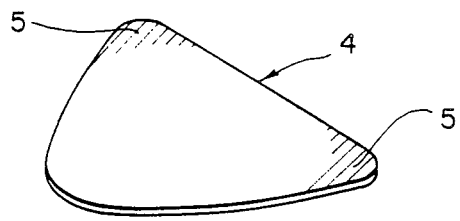
FIG. 4 is a perspective view showing the unevenness of dislocation density that occurs in a triangular like wafer produced according to the boat method.
Figure 5:
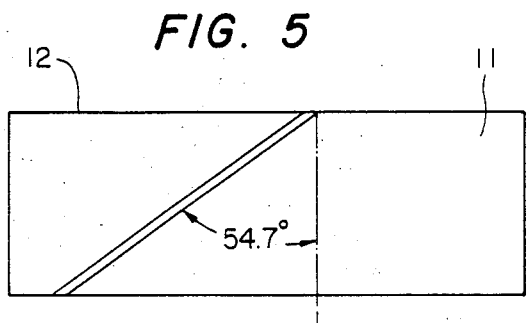
FIG. 5 illustrates the operating theory of slicing a boule obtained by the boat method into wafers having a (100) plane exposed.
Figure 6:
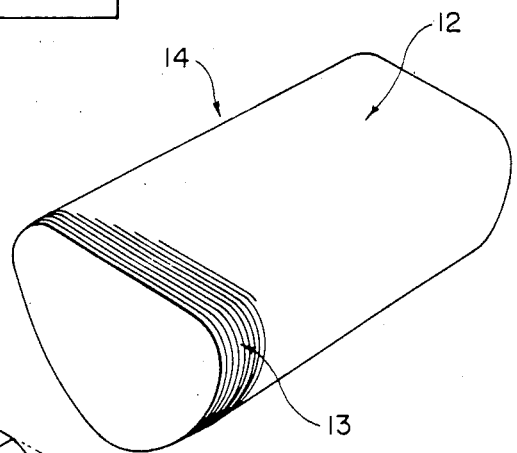
FIG. 6 is a perspective view of a triangular-like prism of wafers that is obtained in one step of a process of the invention.
Figure 7:
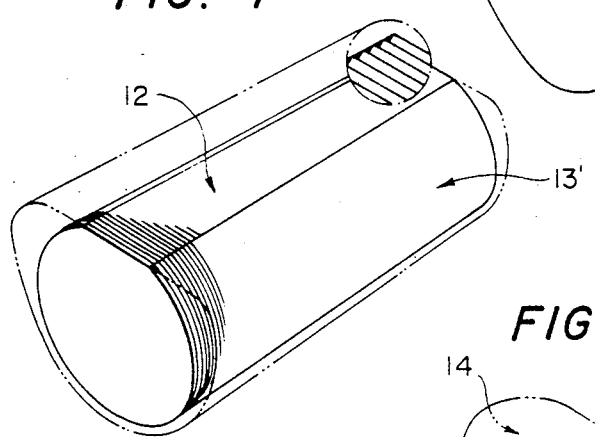
FIG. 7 is a perspective view of a cylinder of wafers obtained by grinding the triangular-like prism of FIG. 6 and is a partially enlarged view of such cylinder.

In the next step, the triangular wafers obtained are held together in a triangular prism, as shown in FIG. 6, by suitable means such as adhering with wax or adhesive. Both edges 14 of the flat surface 12 in the outer periphery of the set of wafers 13 are ground in the longitudinal direction of the triangular prism until a generally cylindrical form is obtained. A centerless grinder is preferred to grind the triangular prism of wafers 13. A generally cylindrical form of wafers as shown in FIG. 7 is automatically produced by grinding the triangular prism of wafers 13 on a centerless grinder.

Figure 8:
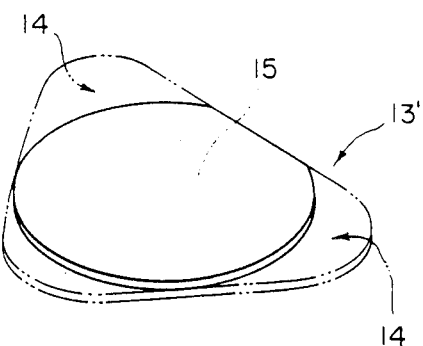
FIG. 8 is a perspective view of a discrete circular wafer separated from the cylinder of FIG. 7.

Next, the cylinder of wafers is separated into discrete circular wafers 13' (see FIG. 8) by heating or using a solvent. For the sake of convenience in the subsequent steps used for processing the wafer 13', it is often desired that the triangular prism of wafers to be ground into a generallly cylindrical form having a small flat surface area 12. The thus obtained cylinder of wafers is such that the flat surface 12 is inclined to the (100) cut plane 15 of the circular wafer 13' so that, desirably, the flat surface 12 of the cylinder is surface-ground until it is vertical to the (100) cut plane 15.

The individual circular wafers 15 thus produced have a uniform low dislocation density because of the absence of the edges 14 of high dislocation density. A further advantage that can be expected from these wafers 15 is that they have relatively few crystal defects which is an inherent characteristic of the boat method.

In a typical example, a circular wafer produced by the process of the invention has 2,000 to 5,000 dislocations per square centimeter whereas a circular wafer produced from a boule made by the pulling method has as many as 20,000 to 50,000 dislocations for the same area. Therefore, the process of the invention provides a circular gallium arsenide wafer that contains fewer crystal defects and a more uniform and lower dislocation density than a wafer produced by the pulling method. Accordingly, the process of the invention for producing a circular gallium arsenide wafer provides gallium arsenide substrate crystals having a good performance.

What is claimed is:

1. A process for producing circular gallium arsenide wafers comprising the steps of: growing a gallium arsenide single-crystal boule in the form of a longitudinal half of cylinder by a boat method in such a manner that the intersection of a flat surface produced by the boat method and a plane vertical to the direction of the crystal growth extends in a <110> direction;

slicing the boule into wafers to expose a (100) plane inclined by more than 0.5 degrees with respect to the (100) plane;
assembling the resulting triangular wafers into a triangular prism;
grinding the opposite edges of the flat surface of the outer periphery of said triangular prism of wafers in a direction in which the wafers are assembled and grinding away high dislocation density triangular portions of said prism, such that said prism is ground into a generally cylindrical form; and
separating said triangular prism into discrete circular wafers.

2. The process of claim 1 wherein said plane produced by said step of slicing is inclined by 0.5 to 5 degrees with respect to the (100) plane.

3. The process of claim 1 wherein said step of assembling said resulting triangular wafer comprises adhering said wafers with a material selected from the group consisting of waxes and adhesives.

4. The process of claim 1 wherein said step of grinding comprises grinding said prism of wafers into a generally cylindrical form having a small flat area.

5. The process of claim 1 wherein said step of separating comprises heating.

6. The process of claim 1 wherein said step of separating comprises applying a solvent.

7. A process for producing circular gallium arsenide wafers comprising the steps of:
growing a gallium arsenide single crystal boule in the form of a longitudinal half of a cylinder by a boat method in such a manner that the intersection of a flat surface produced by the boat method and a plane vertical to the direction of the crystal growth extends in a (100) direction;
slicing the boule into wafers to expose a (100) plane;
assembling the resulting substantially triangular wafers into a triangular prism;
grinding the opposite edges of the flat surface of the outer periphery of said triangular prism of wafers in a direction in which the wafers are assembled and grinding away high dislocation density triangular portions of said prism, such that said prism is ground into a generally cylindrical form; and
separating said triangular prism into discrete circular wafers.

* * * * *